United States Patent
Lee

(10) Patent No.: US 9,947,819 B2
(45) Date of Patent: Apr. 17, 2018

(54) SOLAR CELL MODULE AND METHOD OF FABRICATING THE SAME

(75) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 103 days.

(21) Appl. No.: 14/352,368

(22) PCT Filed: Jun. 19, 2012

(86) PCT No.: PCT/KR2012/004842
§ 371 (c)(1),
(2), (4) Date: Aug. 18, 2014

(87) PCT Pub. No.: WO2013/058462
PCT Pub. Date: Apr. 25, 2013

(65) Prior Publication Data
US 2015/0000734 A1    Jan. 1, 2015

(30) Foreign Application Priority Data
Oct. 17, 2011   (KR) ................. 10-2011-0106119

(51) Int. Cl.
*H01L 31/048*   (2014.01)
*H01L 31/049*   (2014.01)

(52) U.S. Cl.
CPC ........ *H01L 31/0481* (2013.01); *H01L 31/048* (2013.01); *H01L 31/049* (2014.12); *Y02E 10/50* (2013.01)

(58) Field of Classification Search
CPC ............ H01L 31/048; H01L 31/0481; H01L 31/0488; H01L 31/049
See application file for complete search history.

(56) References Cited

U.S. PATENT DOCUMENTS

| | | | |
|---|---|---|---|
| 5,507,880 A | * | 4/1996 | Ishikawa .......... H01L 31/02167 136/251 |
| 6,215,060 B1 | | 4/2001 | Komori et al. |
| 6,323,416 B1 | * | 11/2001 | Komori et al. ............... 136/259 |
| 2001/0054437 A1 | | 12/2001 | Komori et al. |
| 2004/0029311 A1 | * | 2/2004 | Snyder et al. ................ 438/106 |
| 2005/0051204 A1 | * | 3/2005 | Oi et al. ........................ 136/251 |
| 2005/0103376 A1 | * | 5/2005 | Matsushita ............. H02S 30/10 136/251 |
| 2007/0295400 A1 | * | 12/2007 | Brabec et al. ................ 136/263 |

(Continued)

FOREIGN PATENT DOCUMENTS

| | | |
|---|---|---|
| JP | H10-93124 A | 4/1998 |
| JP | H10-294486 A | 11/1998 |

(Continued)

OTHER PUBLICATIONS

International Search Report in International Application No. PCT/KR2012/004842, filed Jun. 19, 2012.

*Primary Examiner* — Bethany L Martin
(74) *Attorney, Agent, or Firm* — Saliwanchik, Lloyd & Eisenschenk

(57) ABSTRACT

Disclosed are a solar cell module and a method of fabricating the same. The solar cell module includes a support substrate including a lateral side, at which a 1st bending portion is formed, and a rear side at which a 2nd bending portion is formed, a solar cell on the support substrate, and a protective layer on the support substrate and the solar cell.

17 Claims, 2 Drawing Sheets

(56) References Cited

U.S. PATENT DOCUMENTS

| | | | | |
|---|---|---|---|---|
| 2010/0051087 A1* | 3/2010 | Keshner | ................ | H01L 31/048 136/246 |
| 2011/0048535 A1* | 3/2011 | Nagyvary | ......... | H01L 31/02008 136/259 |
| 2011/0155221 A1* | 6/2011 | Yu | ........................ | H01L 31/048 136/251 |
| 2011/0269883 A1* | 11/2011 | Battenhausen | .......... | C08K 5/20 524/226 |
| 2012/0222725 A1* | 9/2012 | Albright | ............... | H01L 31/048 136/251 |

FOREIGN PATENT DOCUMENTS

| | | |
|---|---|---|
| JP | 2004-214230 A | 7/2004 |
| JP | 2007299545 A * | 11/2007 |

* cited by examiner

[Fig. 1]
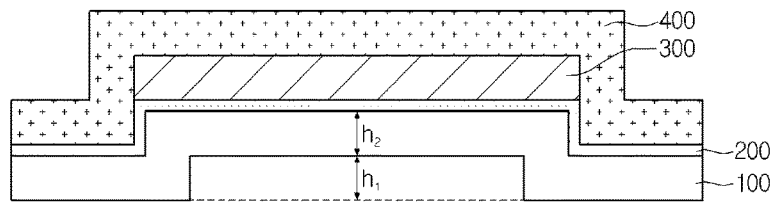
[Fig. 2]
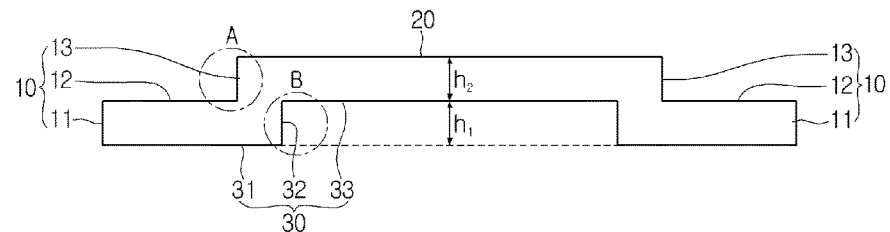
[Fig. 3]
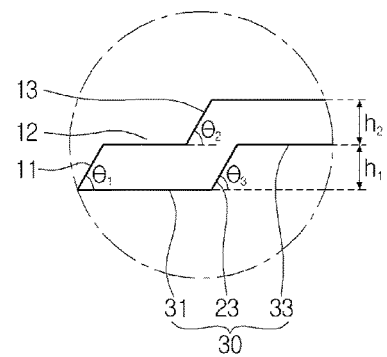
[Fig. 4]
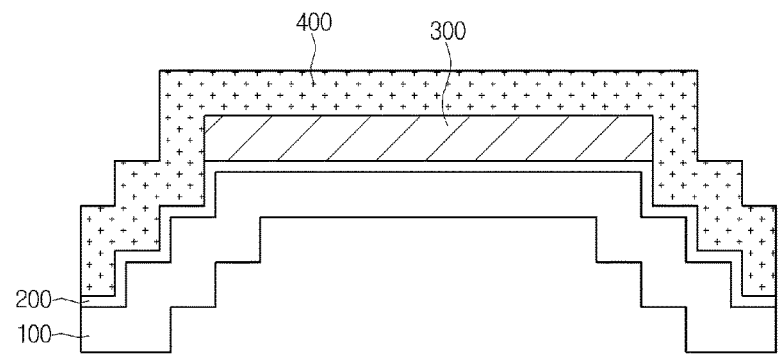
[Fig. 5]
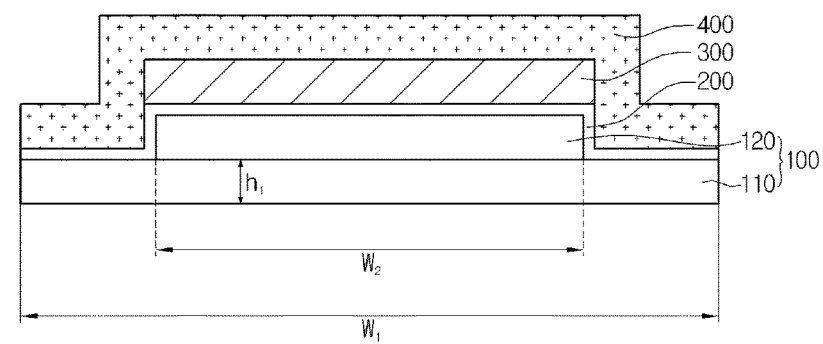

[Fig. 6]
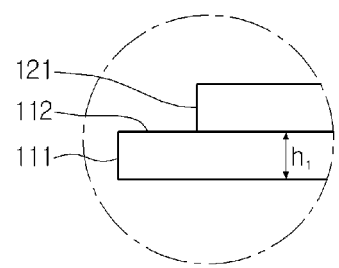

SOLAR CELL MODULE AND METHOD OF FABRICATING THE SAME

CROSS-REFERENCE TO RELATED APPLICATIONS

This application is the U.S. national stage application of International Patent Application No. PCT/KR2012/004842, filed Jun. 19, 2012, which claims priority to Korean Application No. 10-2011-0106119, filed Oct. 17, 2011, the disclosures of each of which are incorporated herein by reference in their entirety.

TECHNICAL FIELD

The embodiment relates to a solar cell module and a method of fabricating the same.

BACKGROUND ART

Solar cells may be defined as devices to convert light energy into electrical energy by using a photovoltaic effect of generating electrons when light is incident onto a P-N junction diode. The solar cells may be classified into a silicon solar cell, a compound semiconductor solar cell mainly including a group I-III-VI compound or a group III-V compound, a dye-sensitized solar cell, and an organic solar cell according to materials constituting the junction diode.

The minimum unit of the solar cell is a cell. In general, one cell generates a very small voltage of about 0.5V to about 0.6V. Therefore, a panel-shape structure of connecting a plurality of cells to each other in series on a substrate to generate voltages in a range of several voltages V to several hundreds of voltages V is referred to as a module, and a structure having several modules installed in a frame is referred to as a solar cell apparatus.

Typically, the solar cell apparatus has a structure of glass/filling material (ethylene vinyl acetate, EVA)/solar cell module/filling material (EVA)/surface material (back sheet).

In general, the glass includes low-iron tempered glass. The glass must represent high light transmittance and be treated to reduce the surface reflection loss of incident light. The EVA used as the filling material is interposed between the front/rear side of the solar cell and the back sheet to protect a fragile solar cell device. When the EVA is exposed to UV light for a long time, the EVA may be discolored, and the moisture proof performance of the EVA may be degraded. Accordingly, when the module is fabricated, it is important to select a process suitable for the characteristic of the EVA sheet so that the life span of the module can be increased, and the reliability of the module can be ensured. The back sheet is placed on a rear side of the solar cell module. The back sheet must represent superior adhesive strength between layers, must be easily handled, and must protect the solar cell device from an external environment.

The solar cell apparatus must have resistance against external moisture ($H_2O$) or external oxygen ($O_2$), and the problem related to the reliability must be solved in order to improve the performance of the solar cell. According to the related art, in order to solve the problem, a sealing treatment is performed with respect to the solar cell apparatus. However, even though the solar cell is sealed, moisture is infiltrated into the solar cell apparatus along the interfacial surface between a substrate and a sealing member, so that a solar cell electrode is corroded, thereby degrading the performance of the solar cell apparatus.

DISCLOSURE OF INVENTION

Technical Problem

The embodiment provides a solar cell module, which can be improved in terms of reliability and stability, and a method of fabricating the same.

Solution to Problem

According to the embodiment, there is provided a solar cell module which includes a support substrate including a lateral side, at which a 1st bending portion is formed, and a rear side at which a 2nd bending portion is formed, a solar cell on the support substrate, and a protective layer on the support substrate and the solar cell.

According to the embodiment, there is provided a solar cell module which includes a 2nd support substrate on a 1st support substrate, a solar cell on the 2nd support substrate, and a protective layer on the 1st support substrate and the solar cell. The 1st and 2nd support substrates form a step layer structure.

Advantageous Effects of Invention

According to the solar cell module of the embodiment, a step is formed at the lateral side of the support substrate, thereby minimizing the infiltration of moisture ($H_2O$) or oxygen ($O_2$) into the solar cell. In addition, the lateral side having the step can extend the infiltration path of the moisture or the oxygen.

Therefore, according to the solar cell module of the embodiment, the solar cells are effectively protected from the moisture and the oxygen, so that the stability and the reliability of the device can be significantly ensured.

BRIEF DESCRIPTION OF DRAWINGS

FIGS. 1 and 4 are sectional views showing a solar cell module according to the embodiment;

FIGS. 2 and 3 are sectional views showing a support substrate according to the embodiment;

FIG. 5 is a sectional view showing a solar cell module according to another embodiment; and FIG. 6 is a sectional view showing a support substrate according to another embodiment.

MODE FOR THE INVENTION

In the description of the embodiments, it will be understood that when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

FIGS. 1 and 4 are sectional views showing a solar cell module according to the embodiment, and FIGS. 2 and 3 are sectional views showing a support substrate according to the embodiment.

Referring to FIG. 1, the solar cell module according to the embodiment includes a support substrate 100, a barrier layer 200, a solar cell 300, and a protective layer 400.

The support substrate 100 has a plate shape and supports the barrier layer 200, the solar cell 300, and the protective layer 400.

The support substrate 100 may be a rigid panel or a flexible panel. In more detail, the support substrate 100 may be a flexible panel.

The support substrate 100 includes a glass panel, a plastic panel, or a metallic panel.

In more detail, the support substrate 100 may be a flexible plastic panel or a flexible metallic panel. For example, the support substrate 100 may be a stainless steel panel, a PET (polyethylene terephthalate) panel, or a polyimide panel, but the embodiment is not limited thereto.

Referring to FIG. 2, the support substrate 100 is provided at a lateral side 10 thereof and a rear side 30 thereof with bending portions, respectively. In more detail, a 1st bending portion A is formed at the lateral side 10 of the support substrate 100, and a 2nd boding portion B is formed one the rear side 30 of the support substrate 100.

Referring to FIG. 2, the 1st bending portion A formed at the lateral side 10 of the support substrate 100 has a step structure. Although FIGS. 1 and 2 show a single step structure, the embodiment is not limited thereto. In other words, the 1st bending portion A may have a multi-step structure as shown in FIG. 4.

The 1st bending portion A may include a 1st inclined surface 11, a 1st connection surface 12 connected to one end of the 1st inclined surface 11, and a 1st' inclined surface 13 connected to the other end of the 1st connection surface 12.

The 1st inclined surface 11 and the 1st' inclined surface 13 may be inclined at a predetermined angle with respect to a ground surface. Referring to FIG. 2, the 1st and 1st' inclined surfaces 11 and 13 may be inclined at an angle of about 90° with respect to a 2nd connection surface 31. In other words, the 1st and 1st' inclined surfaces 11 and 13 may be perpendicular to the 2nd connection surface 31, but the embodiment is not limited thereto.

In addition, referring to FIG. 3, the 1st inclined surface 11 may be inclined at an angle of θ1 with respect to the 2nd connection surface 31, and the 1st' inclined surface 13 may be inclined at an angle of θ2 with respect to the 2nd connection surface 31. The angles of θ1 and θ2 may be equal to each other or may be different from each other. For example, the 1st and 1st' inclined surfaces 11 and 13 may be inclined at an angle of 30° to 90° with respect to the 2nd connection surface 31.

The 1st and 1st' inclined surfaces 11 and 13 are connected to each other through a 1st connection surface 12. In other words, one end of the 1st connection surface 12 may be connected to the 1st inclined surface 11, and the other end of the 1st connection surface 12 may be connected to the 1st' inclined surface 13. In this case, the 1st connection surface 12 may be parallel to the 2nd connection surface 31, or may be inclined at a predetermined angle with respect to the 2nd connection surface 31. Preferably, the 1st connection surface 11 is parallel to the 2nd connection surface 31. In addition, if the 1st connection surface 12 is inclined with respect to the 2nd connection surface 31, an angle between the 1st and 2nd connection surfaces 12 and 31 may be in the range of about 10° to about 45°, but the embodiment is not limited thereto.

Referring to FIG. 2, the 2nd bending portion B is formed at the rear side 30 of the support substrate 100. The 2nd bending portion B may include the 2nd connection surface 31, a 2nd inclined surface 32 connected to one end of the 2nd connection surface 31, and a 2nd' connection surface 33 connected to the other end of the 2nd inclined surface 32.

In addition, the 2nd and 2nd' connection surfaces 31 and 33 may be parallel to the ground surface or inclined with respect to each other at a predetermined angle. Preferably, the 2nd and 2nd' connection surfaces 31 and 33 are parallel to the ground surface.

The 2nd and 2nd' connection surfaces 31 and 33 are connected to each other by the 2nd inclined surface 32. In other words, one end of the 2nd inclined surface 32 may be connected to the 2nd connection surface 31, and the other end of the 2nd inclined surface 32 may be connected to the 2nd' connection surface 33. In this case, the 2nd inclined surface 32 may be inclined at a predetermined angle of θ3 with respect to the ground surface. For example, the angle θ3 may be in the range of about 30° to about 90°. In more detail, the angle θ3 may be about 90°.

The solar cell module according to the embodiment may have a 1st step by the 2nd bending portion B. In more detail, the 1st step may have a height h1 of about 100 μm to about 500 μm, but the embodiment is not limited thereto.

As described above, the lateral side and the rear side of the solar cell module according to the embodiment are bent to form steps. Therefore, according to the embodiment, moisture and oxygen can be prevented from being infiltrated into the solar cell as compared with a solar cell having a structure in which a lateral side and a rear side are flat.

In addition, the infiltration path of moisture and oxygen may be extended by the bending structure. In other words, referring to FIGS. 2 and 3, the moisture and the oxygen may be infiltrated into the solar cell only when passing through the 1st inclined surface 11, the 1st connection surface 12, and the 1st' inclined surface 13. In addition, the solar cell module according to the embodiment has a plurality of lateral sides with a bending portion as shown in FIG. 4, thereby more easily preventing the moisture or the oxygen from being infiltrated into the solar cell.

In other words, the solar cell module according to the embodiment can effectively protect solar cells from moisture and oxygen, so that the stability and the reliability of the device can be significantly ensured.

The support substrate 100 may be manufactured through various schemes such as a molding process using a stamp, a dry etching process, a wet etching process, or a process based on a laser light source. In more detail, the support substrate 100 may be manufactured through the molding process using the stamp. For example, the support substrate 100 may be formed by allowing a patterned stamp to make contact with the rear side of the support substrate 100 and pressing the patterned stamp. In addition, according to the method of fabricating the solar cell module of the embodiment, a UV curing process may be performed during the molding process using the stamp, or after the molding process has been performed, but the embodiment is not limited thereto.

The barrier layer 200 is formed on the support substrate 100. In more detail, the barrier layer 200 may be formed at a portion of the lateral side 10 of the support substrate 100 and on a top surface of the support substrate 100. For example, the barrier layer 200 may be formed on the 1st connection surface 12, the 1st' inclined surface 13, and the top surface 20, but the embodiment is not limited thereto.

The barrier layer 200 can prevent the solar cell from being oxidized due to moisture ($H_2O$) or oxygen ($O_2$) so that the electrical characteristics of the solar cell are not deteriorated.

In particular, the barrier layer 200 can easily shield moisture or oxygen from being infiltrated from the lateral side of the solar cell module.

The barrier layer 200 may include an organic barrier layer, an inorganic barrier layer, or an organic/inorganic complex barrier layer. For example, the organic barrier layer may include polyxylene-based polymer. In addition, the inorganic barrier layer may include a compound selected from the group consisting of Al2O3, MgO, BeO, SiC, TiO2, Si3N4, SiO2, and the composition thereof. In more detail, the barrier layer 200 may include aluminum oxide (Al2O3) layer, but the embodiment is not limited thereto.

The solar cell 300 is formed on the top surface 20 of the support substrate 100. In more detail, the solar cell 300 may directly make contact with the barrier layer 200 formed on the top surface 20 of the support substrate 100. In addition, the solar cell 300 may extend in one direction in parallel to the barrier layer 200.

The solar cell 300 includes a plurality of cells, and the cells are electrically connected to each other. For example, the cells may be connected to each other in series, but the embodiment is not limited thereto. Accordingly, the solar cell 300 may convert solar energy into electrical energy.

The solar cell 300 may include a solar cell including a group I-III-IV semiconductor compound such as a CIGS-based solar cell, a silicon-based solar cell, or a dye-sensitized solar cell, but the embodiment is not limited thereto.

The protective layer 400 is provided on the support substrate 100. In more detail, the protective layer 400 may directly make contact with the support substrate 100 and the solar cell 300 formed on the support substrate 100.

The protective layer 400 may be transparent or flexible. The protective layer 400 may include transparent plastic. In more detail, the protective layer 400 may include ethylenevinylacetate resin.

Meanwhile, although the solar cell module having bending portions formed at both of the lateral side and the rear side of the support substrate has been disclosed, the embodiment is not limited thereto. In other words, the solar cell module according to the embodiment may include a support substrate having a bending portion formed only at the lateral side of the panel.

FIG. 5 is a sectional view showing a solar cell module according to another embodiment. Referring to FIG. 5, the solar cell module according to another embodiment includes a 1st support substrate 110, a 2nd support substrate 120, the barrier layer 200, the solar cell 300, and the protective layer 400.

Referring to FIGS. 5 and 6, the 1st and 2nd support substrates 110 and 120 form a step layer structure. In other words, a lateral side 111 of the 1st support substrate 110 may be connected to a lateral side 121 of the 2nd support substrate 120 through a 1st connection surface 112 formed on the top surface of the 1st support substrate 110.

The 1st support substrate 110 has a width W1 wider than a width W2 of the 2nd support substrate 120. In addition, the height h1 of the 1st support substrate 110 may be in the range of about 100 μm to about 500 μm, but the embodiment is not limited thereto.

As described above, the lateral side of the solar cell module according to another embodiment has a step layer structure so that the step having the 1st height h1 is formed. In addition, the infiltration path of oxygen can be more extended, and the infiltration of the moisture and the oxygen can be more minimized when comparing with the solar cell having a structure in which the lateral side and the rear side are flat.

Meanwhile, although not shown, the solar cell module according to the embodiment may further include a protective panel, a frame, a bus bar, a junction box, and a cable.

The protective panel is provided on the protective layer 400. The protective panel protects the solar cells 120 from external physical shock and/or foreign matters. The protective panel is transparent, for example, may include tempered glass.

The frame receives the support substrate 100 to the protective layer 400 while supporting the support substrate 100 to the protective layer 400. The frame fixes the support substrate 100 and the protective layer 400.

The bus bar makes contact with the top surface of the solar cell 300, and may be connected to the circuit board in the junction box through a wire.

The junction box may be provided on a bottom surface of the support substrate 100. The junction box may receive the circuit board on which diodes are mounted. According to the solar cell of the embodiment, the cable extends from the junction box. The cable is connected to the bus bar through the circuit board received in the junction box. In addition, the cable is connected to another solar cell.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising in the following order:
   a support substrate including a lateral side, at which a first bending portion is formed, a rear side at which a second bending portion is formed, and a top surface;
   a barrier layer on the entire top surface of the support substrate;
   a solar cell on the support substrate; and
   a protective layer on the support substrate and the solar cell;
   wherein the first bending portion is disposed at a position lower than that of a bottom surface of the solar cell,
   wherein the first bending portion includes a first inclined surface, a second inclined surface, and a first connection surface connecting the first inclined surface with the second inclined surface;
   wherein the second bending portion includes a second connection surface, a third connection surface, and a third inclined surface connecting the second connection surface with the third connection surface;

wherein the solar cell is disposed between the barrier layer and the protective layer, wherein a bottom surface of the solar cell is in direct contact with a portion of a top surface of the barrier layer, wherein a top surface of the solar cell and a side surface of the solar cell are in direct contact with the protective layer, wherein the first bending portion and the protective layer each have a stepwise structure wherein the stepwise structures have the same shape and extend in the same direction towards incident radiation, and wherein the support substrate includes glass.

2. The solar cell module of claim 1, wherein each of the first and second bending portions has a step structure.

3. The solar cell module of claim 1, wherein the first bending portion includes the first inclined surface and the second inclined surface both inclined at a predetermined angle with respect to the rear side of the support substrate.

4. The solar cell module of claim 1, wherein the first connection surface is parallel to the second connection surface.

5. The solar cell module of claim 1, wherein the first connection surface is inclined at an angle of 10° to 45° with respect to the second connection surface.

6. The solar cell module of claim 1, wherein the first and second inclined surfaces are inclined at an angle of 30° to 90° with respect to the second connection surface.

7. The solar cell module of claim 3, wherein the angle is in a range of 30° to 90°.

8. The solar cell module of claim 3, wherein the angle is 90°.

9. The solar cell module of claim 1, wherein the second bending portion has a step having a first height, and the first height is in a range of 100 μm to 500 μm.

10. A solar cell module comprising in the following order:
a first support substrate;
a second support substrate on the first support substrate;
a barrier layer on the first and second support substrates;
a solar cell on the second support substrate; and
a protective layer on the first support substrate and the solar cell;
wherein the first and second support substrates form a step layer structure;
wherein the barrier layer is in direct contact with a portion of a top surface of the first support substrate, an entire lateral side of the second support substrate, and an entire top surface of the second support substrate;
wherein the solar cell is disposed between the barrier layer and the protective layer,
wherein a bottom surface of the solar cell is in direct contact with a portion of a top surface of the barrier layer,
wherein a top surface of the solar cell and a side surface of the solar cell are in direct contact with the protective layer,
wherein the first and second support substrates each includes glass, and
wherein the first and second support substrates and protective layer each have a stepwise structure wherein the stepwise structures have the same shape and extend in the same direction towards incident radiation.

11. The solar cell module of claim 10, wherein the first support substrate has a width wider than a width of the second support substrate.

12. The solar cell module of claim 10, wherein a lateral side of the first support substrate is connected to the lateral side of the second support substrate by a first connection surface provided on the top surface of the first support substrate.

13. The solar cell module of claim 10, wherein the first support substrate has a height of 100 μm to 500 μm.

14. The solar cell module of claim 1, wherein the barrier layer includes an organic barrier layer or an inorganic barrier layer,
wherein the organic barrier layer includes polyxylene-based polymer, and
wherein the inorganic barrier layer includes a compound selected from the group consisting of Al2O3, MgO, BeO, SiC, TiO2, Si3N4, SiO2, and the composition thereof.

15. The solar cell module of claim 10, wherein the barrier layer includes an organic barrier layer or an inorganic barrier layer,
wherein the organic barrier layer includes polyxylene-based polymer, and
wherein the inorganic barrier layer includes a compound selected from the group consisting of Al2O3, MgO, BeO, SiC, TiO2, Si3N4, SiO2, and the composition thereof.

16. The solar cell module of claim 1, wherein the protective layer is disposed on the first inclined surface, the second inclined surface, and the first connection surface.

17. The solar cell module of claim 10, wherein the protective layer is disposed on the top surface of the first support substrate, the lateral side of the second support substrate, and the top surface of the second support substrate.

* * * * *